(12) United States Patent
Hohlfeld et al.

(10) Patent No.: US 10,096,584 B2
(45) Date of Patent: Oct. 9, 2018

(54) METHOD FOR PRODUCING A POWER SEMICONDUCTOR MODULE

(71) Applicant: Infineon Technologies AG, Neubiberg (DE)

(72) Inventors: Olaf Hohlfeld, Warstein (DE); Guido Boenig, Warstein (DE); Irmgard Escher-Poeppel, Duggendorf (DE); Edward Fuergut, Dasing (DE); Martin Gruber, Schwandorf (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 15/337,733

(22) Filed: Oct. 28, 2016

(65) Prior Publication Data

US 2017/0125395 A1    May 4, 2017

(30) Foreign Application Priority Data

Oct. 30, 2015    (DE) .......................... 10 2015 118 664

(51) Int. Cl.
*H01L 21/00* (2006.01)
*H01L 25/00* (2006.01)
(Continued)

(52) U.S. Cl.
CPC .............. *H01L 25/50* (2013.01); *H01L 21/50* (2013.01); *H01L 21/56* (2013.01); *H01L 21/561* (2013.01); *H01L 23/142* (2013.01); *H01L 23/3121* (2013.01); *H01L 23/3135* (2013.01); *H01L 23/5386* (2013.01); *H01L 24/48* (2013.01); *H01L 25/0655* (2013.01); *H01L 25/072* (2013.01); *H01L 2021/60015* (2013.01); *H01L 2021/60022* (2013.01); *H01L 2021/60277* (2013.01); *H01L 2224/4813* (2013.01); *H01L 2224/48139* (2013.01); *H01L 2224/48245* (2013.01); *H01L 2924/00014* (2013.01)

(58) Field of Classification Search
None
See application file for complete search history.

(56) References Cited

U.S. PATENT DOCUMENTS

2006/0006523 A1* 1/2006 Coyle ................. B81C 1/00333
                                                            257/704
2008/0217761 A1* 9/2008 Yang ....................... H01L 24/24
                                                            257/700
2014/0262475 A1    9/2014 Liu et al.

FOREIGN PATENT DOCUMENTS

DE       19617055 C1      6/1997
EP        2804209 A1     11/2014
JP     2000200800 A       7/2000

* cited by examiner

*Primary Examiner* — Reema Patel
(74) *Attorney, Agent, or Firm* — Murphy, Bilak & Homiller, PLLC

(57) ABSTRACT

In order to produce a power semiconductor module, a circuit carrier is populated with a semiconductor chip and with an electrically conductive contact element. After populating, the semiconductor chip and the contact element are embedded into a dielectric embedding compound, and the contact element is exposed. In addition, an electrically conductive base layer is produced which electrically contacts the exposed contact element and which bears on the embedding compound and the exposed contact element. A prefabricated metal film is applied to the base layer by means of an electrically conductive connection layer.

29 Claims, 3 Drawing Sheets

(51) Int. Cl.
  *H01L 21/50* (2006.01)
  *H01L 21/56* (2006.01)
  *H01L 23/14* (2006.01)
  *H01L 23/31* (2006.01)
  *H01L 23/538* (2006.01)
  *H01L 23/00* (2006.01)
  *H01L 25/065* (2006.01)
  *H01L 25/07* (2006.01)
  *H01L 21/60* (2006.01)

METHOD FOR PRODUCING A POWER SEMICONDUCTOR MODULE

PRIORITY CLAIM

This application claims priority to German Patent Application No. 10 2015 118 664.0 filed on 30 Oct. 2015, the content of said application incorporated herein by reference in its entirety.

TECHNICAL FIELD

The present invention relates to power semiconductor modules.

BACKGROUND

The electrical contacting of power semiconductor modules proves to be very complex owing to the required current-carrying capacity of the module terminals.

SUMMARY

According to an embodiment, a method is provided for producing a power semiconductor module which has electrical terminal contacts having a high current-carrying capacity and which are simple to produce.

In order to produce such a power semiconductor module, a circuit carrier is populated with a semiconductor chip and with an electrically conductive contact element. After populating, the semiconductor chip and the contact element are embedded into a dielectric embedding compound, and the contact element is exposed. In addition, an electrically conductive base layer is produced which electrically contacts the exposed contact element and which bears on the embedding compound and the exposed contact element. A prefabricated metal film is applied to the base layer by means of an electrically conductive connection layer.

Those skilled in the art will recognize additional features and advantages upon reading the following detailed description, and upon viewing the accompanying drawings.

BRIEF DESCRIPTION OF THE DRAWINGS

The invention is explained below on the basis of exemplary embodiments with reference to the accompanying figures. The illustration in the figures is not to scale. In the figures.

DETAILED DESCRIPTION

Figure 1:
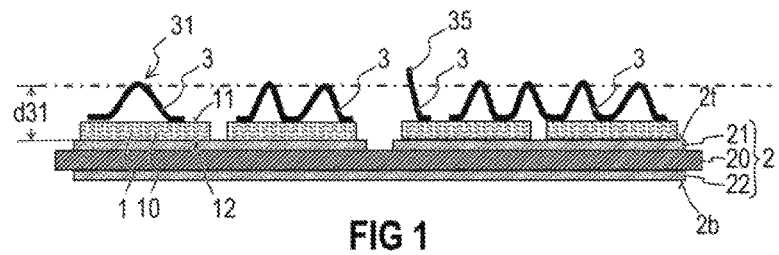
FIGS. 1 to 5 show different steps of a method for producing a power semiconductor module comprising a prefabricated metal film having a high current-carrying capacity.

FIG. 1 shows a cross section through a circuit carrier 2 populated with one or more semiconductor chips 1 and with one or more electrically conductive contact elements 3. The contact elements 3 are illustrated as bonding wires merely by way of example.

The circuit carrier 2 comprises a dielectric isolation carrier 20, which is formed as a flat lamina and which has an upper main surface and a lower main surface opposite thereto. An upper metallization layer 21 is applied to the upper main surface of the isolation carrier 20, and can optionally be structured to form conductor tracks and/or conductor surfaces. In addition, an optional lower metallization layer 22 is applied to the lower main surface of the isolation carrier 20, which lower metallization layer is unstructured, but can alternatively also be structured. That side of the upper metallization layer 21 which faces away from the isolation carrier 20 forms the top side 2t of the circuit carrier 2. If a lower metallization layer 22 is present, its side facing away from the isolation carrier 20 forms the underside 2b of the circuit carrier 2.

The metallization layers 21 and 22 are fixedly and cohesively connected to the isolation carrier 20. In particular, the upper metallization layer 21 can be fixedly and cohesively connected to the isolation carrier 20 over its entire side facing the isolation carrier 20. Correspondingly, the lower metallization layer 22 can also be fixedly and cohesively connected to the isolation carrier 20 over its entire side facing the isolation carrier 20.

The isolation carrier 20 is electrically insulating. It can comprise ceramic or consist of ceramic, for example. Suitable ceramics are e.g. aluminum nitride (AlN), aluminum oxide ($Al_2O_3$), silicon nitride ($Si_3N_4$), silicon carbide (SiC) or beryllium oxide (BeO) or other dielectric ceramics. The upper metallization layer 21 and the lower metallization layer 22 can consist for example of copper, a copper alloy, aluminum or an aluminum alloy. Other metals, including alloys, having good electrical conductivity can likewise be used, however.

In accordance with one example, the circuit carrier 2 can be a DCB substrate (DCB=direct copper bonded) wherein the upper metallization layer 21 and—if present—the lower metallization layer 22 are produced by prefabricated copper films that are superficially oxidized being connected to a ceramic isolation carrier 20, for example composed of aluminum oxide, by the DCB process.

A semiconductor chip 1 can be for example a diode, or a controllable semiconductor switch such as e.g. an IGBT (Insulated Gate Bipolar Transistor), a MOSFET (Metal Oxide Semiconductor Field Effect Transistor), a JFET (Junction Field Effect Transistor), a thyristor, or an HEMT (High Electron Mobility Transistor). Such a semiconductor chip 1 can be a so-called vertical component which has a lower chip metallization 12 at its underside facing the circuit carrier 2, has an upper chip metallization 11 at its top side facing away from the circuit carrier 2 and is electrically conductively connected to the upper metallization layer 21 at its lower chip metallization 12, e.g. by means of a connection layer produced for example by soldering, sintering or electrically conductive or electrically insulating adhesive bonding. Consequently, an electrical load current that flows between the upper chip metallization 11 and the lower chip metallization 12 can also flow via the upper metallization layer 21. A solder is used in the case of soldering, a metal powder (e.g. a noble metal powder, for example a silver powder) is used in the case of sintering, or an adhesive is used in the case of adhesive bonding. Within the meaning of the present invention, a chip metallization such as e.g. the upper and lower chip metallizations 11, 12 is a constituent part of a prefabricated semiconductor chip 1. That means that the chip metallization already constitutes a constituent part of the semiconductor chip 1 before the circuit carrier 2 is populated with said semiconductor chip 1. Such a chip metallization can be applied to a semiconductor body 10 of the semiconductor chip 1 while the semiconductor chip 1 is still in the wafer assemblage with semiconductor chips identical to the semiconductor chip 1, that is to say during the wafer processing.

The semiconductor body 10 of the semiconductor chip 1 comprises an arbitrary basic semiconductor material (e.g. silicon, silicon carbide, gallium arsenide, aluminum gallium nitride or any other semiconductor materials used in electronics) which contains one or more p-doped and/or n-doped semiconductor zones. The upper chip metallization 11 and the lower chip metallization 12 are applied to mutually opposite sides of the semiconductor body 10.

Depending on the type of the relevant semiconductor chip 1, the upper chip metallization 11 and the lower chip metallization 12 can be a drain and source, source and drain, emitter and collector, collector and emitter, anode and cathode, or cathode and anode. If the semiconductor chip 1 is a controllable semiconductor component, it can also comprise a control terminal (i.e. a gate or base terminal), not illustrated in the figures.

As is shown in FIG. 1, each contact element 3 can have a portion 31 having a distance d31 of more than 1 mm from the circuit carrier 2 after the populating of the circuit carrier 2 with the contact element 3 and before the below-described embedding of the semiconductor chip 1 and the contact element 3 into an embedding compound 4.

Within the meaning of the present invention, a circuit carrier 2 is populated with a contact element 3 if the contact element 3 is fixedly and cohesively connected to the circuit carrier 2. A circuit carrier 2 is populated with a contact element 3 for example even if firstly a semiconductor chip 1 is provided with a contact element 3 e.g. at its upper chip metallization 11, and only afterward is the circuit carrier 2 fixedly and cohesively connected to the composite assembly comprising semiconductor chip 1 and contact element 3. A circuit carrier 2 is thus populated with a contact element 3 even if the connection between circuit carrier 2 and contact element 3 is only effected indirectly (via the semiconductor chip 1 in the example mentioned). It goes without saying that a contact element 3 can also be permanently electrically conductively connected to the circuit carrier 2 (e.g. to the upper metallization layer 21 thereof or, if the circuit carrier 2 is formed as a leadframe, to the leadframe), without the connection being effected indirectly via a semiconductor chip 1.

Figure 2:
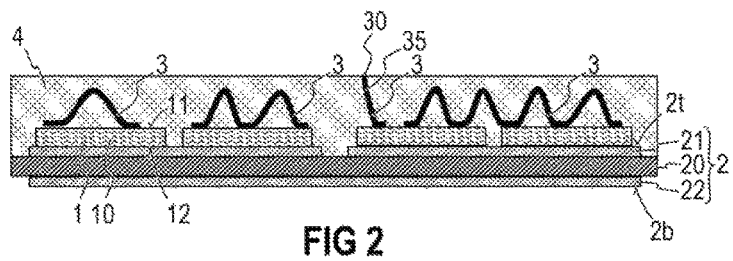

As is furthermore illustrated as the result in FIG. 2, the semiconductor chip(s) 1 and the contact element(s) 3, after the circuit carrier 2 has been populated with them, can be embedded into an embedding compound 4. For embedding purposes, the embedding compound 4 can initially be present wholly or partly in liquid or pasty form and then be cured.

A polymer can be used as embedding compound 4, or the latter can comprise a polymer. By way of example, the embedding compound 4 can comprise a matrix (e.g. a polymer) into which a (preferably dielectric) filler is embedded which has good thermal conductivity and which has a coefficient of linear thermal expansion that is significantly lower than the coefficient of linear thermal expansion of the matrix. What can be achieved thereby is that the coefficient of linear thermal expansion of the cured embedding compound 4 does not differ from the coefficient of linear thermal expansion of the semiconductor chip 1 to such a great extent that there is a risk of the semiconductor chip 1 breaking if the semiconductor module is exposed to relatively great temperature fluctuations. By way of example, the cured embedding compound 4 can have a coefficient of linear thermal expansion of less than 9 ppm/K. By way of example, an epoxy resin is suitable as polymer.

If the embedding compound 4 comprises a filler, the latter can be formed e.g. by a pulverulent and/or granular and/or fibrous material. By way of example, ceramics such as e.g. aluminum oxide, aluminum nitride, cordierite, and/or glass are suitable as pulverulent or granular material. By way of example, glass fibers are suitable as fibrous material.

After the embedding, one, a plurality or all of the contact elements 3 may be completely covered by the embedding compound 4, or one, a plurality or all of the contact elements 3 may be only partly covered by the embedding compound 4. If a contact element 3 is only partly covered by the embedding compound 4, a portion 30 of said contact element 3 may project slightly from the embedding compound 4 at that side thereof which faces away from the circuit carrier 2. Such slight projection can be achieved for example by means of a so-called film-assisted molding method. In this case, the inner side of the mold is lined with a film into which the portions 30 press, such that the portions 30 remain free during subsequent potting or encapsulation by injection molding with the embedding compound 4. If such a portion 30 is situated in the region of a loop of a contact element 3 formed as a bonding wire, the method can be set such that the relevant portion 30 projects from the embedding compound 4 by a maximum of half of the diameter of the relevant bonding wire.

Examples of suitable methods for embedding the semiconductor chip(s) 1 and the contact element(s) 3 into the embedding compound 4 include injection molding, compression molding, liquid molding, potting, vacuum potting or lamination. In liquid molding, the molding compound is applied in liquid form to the component to be potted. The mold is then closed. In this case, the entire mold is filled by molding compound and the compound cures under temperature. The compound is thus not injected into the closed mold, but rather dispensed into the open mold prior to closing. However, lamination is not suitable in conjunction with contact elements 3 formed as bonding wire.

In all configurations of the invention, optionally after embedding the semiconductor chip(s) 1 and the contact element(s) 3 and, if appropriate, after curing the embedding compound 4, the embedding compound 4 can extend as far as the circuit carrier 2 and/or as far as the semiconductor chip(s) 1 and/or as far as the contact element(s) 3.

Figure 3:
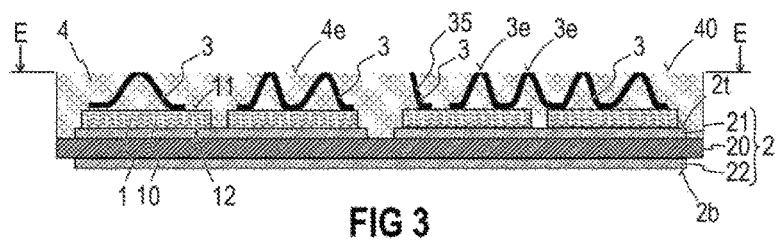

As is furthermore shown as the result in FIG. 3, the embedded contact element(s) 3 are exposed, for example at that side of the embedding compound 4 which faces away from the circuit carrier 2. The exposing can be carried out, in principle, by means of arbitrary techniques, for example milling, grinding, laser treatment. In this case, different techniques can also be combined arbitrarily. After the exposing, the composite assembly comprising the embedding compound 4 and the contact element(s) 3 embedded into it may have a planar surface 40 at its side facing away from the circuit carrier 2.

As a result of the exposing, the contact elements 3 and the embedding compound 4 may in each case have a planar surface portion 3e and 4e, respectively, which are arranged in one plane E-E.

Optionally, the exposing can be carried out such that in the case of a contact element 3 formed as a bonding wire that forms a bonding loop, a maximum of half of the diameter of the bonding wire is removed, such that the bonding wire is not severed. Alternatively, however, such a bonding wire can also be severed, which is explained below with reference to FIG. 9.

Figure 4:
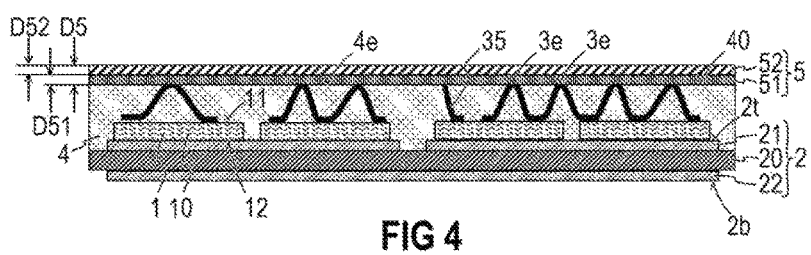

After the exposing, as is illustrated as the result in FIG. 4, an electrically conductive base layer 5 is produced which electrically contacts the exposed contact element(s) 3 and which bears on the embedding compound 4 and the exposed contact element(s) 3.

Optionally, after exposing the contact element(s) 3 and before producing the base layer 5, where the base layer 5 later bears on the embedding compound 4 (for example on the surface 40), the embedding compound 4 can be subjected to a plasma treatment in order to improve the adhesion of the base layer 5 to the embedding compound 4.

Producing the base layer 5 comprises producing an electrically conductive seed layer 51 (also referred to as nucleation layer) which bears directly on the embedding compound 4. Producing the seed layer 51 can be carried out for example by electroless deposition and/or sputtering. The seed layer 51 can consist of exactly one or of two or more of the following materials: titanium (Ti), titanium-tungsten (TiW), copper (Cu), palladium (Pd), nickel (Ni).

The layer thickness D51 of the finished seed layer 51 can be chosen arbitrarily, in principle. By way of example, the layer thickness D51 can be chosen to be less than or equal to 5 µm.

Optionally, producing the base layer 5 can comprise producing an electrically conductive reinforcement layer 52 on the previously produced seed layer 51. By way of example, the reinforcement layer 52 can be produced by electrodeposition. In this case, the previously produced seed layer 51 can be used as an electrode for the electrodeposition process. The layer thickness D52 of the finished reinforcement layer 52 can be chosen arbitrarily, in principle. In order to achieve economic manufacture, it may be advantageous if the layer thickness D52 is chosen not to be excessively large, for example not greater than 100 µm. In order additionally to achieve a sufficient mechanical reinforcement of the seed layer 51, it may be advantageous if the layer thickness D52 is chosen not to be excessively small. By way of example, the layer thickness D52 can be chosen such that the layer thickness D5 of the base layer 5 is in the range of 5 µm to 50 µm. The layer thickness D52 of the reinforcement layer 52 can be chosen to be for example in the range of 15 µm to 100 µm.

Suitable materials for the reinforcement layer 52 produced include materials having good electrical conductivity such as, for example, copper, i.e. the finished reinforcement layer 52 can comprise copper or consist of copper.

As shown, the base layer 5 can optionally consist of the seed layer 51 and the reinforcement layer 52. That means that the reinforcement layer 52 directly adjoins the seed layer 51.

The seed layer 51 can optionally consist of exactly one material or of a homogeneous material mixture. Independently thereof, a reinforcement layer 52, if provided, can optionally consist of exactly one material or of a homogeneous material mixture.

Figure 5:
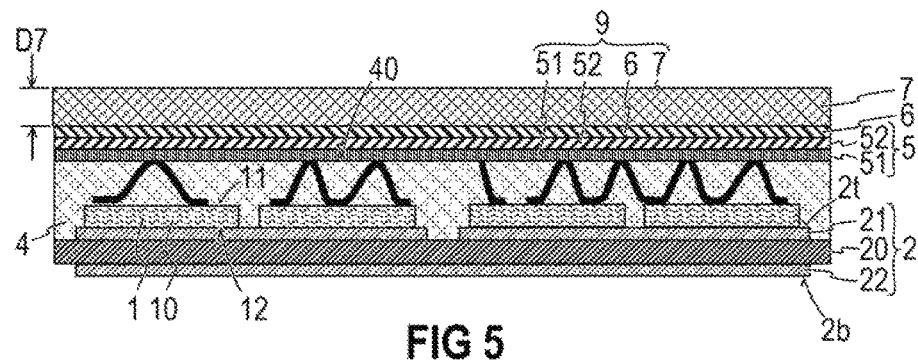

As is furthermore shown as the result in FIG. 5, a prefabricated metal film 7 is applied to the base layer 5, said metal film being cohesively connected to the base layer 5 by means of an electrically conductive connection layer 6. The metal film 7 has a high current-carrying capacity and can therefore be used for carrying high currents of the semiconductor module. For this purpose, the metal film 7—before and after application—can have a layer thickness D7 of at least 100 µm. By way of example, the layer thickness D7 can be in the range of 100 µm to 400 µm.

Examples of suitable material for the metal film 7 include copper or aluminum, i.e. the metal film 7 can consist of copper or of aluminum, or it can comprise copper and/or aluminum.

The connection layer 6 can be formed for example as a solder layer, in particular as a diffusion solder layer, or as a sintering layer or as an adhesive layer. After applying the metal film 7, the connection layer 6 directly adjoins both the base layer 5 and the metal film 7.

The base layer 5 (comprising the seed layer 51 and optionally comprising the reinforcement layer 52), the connection layer 6 and the metal film 7 together form a metallization 9 of the semiconductor module, which can be structured as necessary to form conductor tracks and/or electrical contacts. As is illustrated in FIG. 5, the seed layer 51, the reinforcement layer 52 (if present), the connection layer 6 and the metal film 7 (i.e. the module metallization 9 overall) can be formed as unstructured layers and then be structured jointly.

Figure 6:
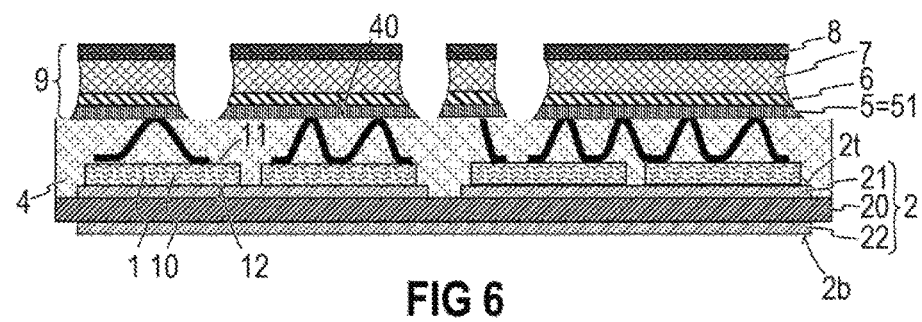
FIG. 6 shows a method in which the prefabricated metal film and underlying conductor layers are structured jointly.

The joint structuring can be carried out for example by means of a masked etching of the seed layer 51, of the reinforcement layer 52 (if present), of the connection layer 6 and of the metal film 7 using a (e.g. photolithographically) structured etching mask 8, as is shown in FIG. 6 after the conclusion of the etching process. The etching mask 8 can then be removed again from the structured metal film 7.

Figure 7:
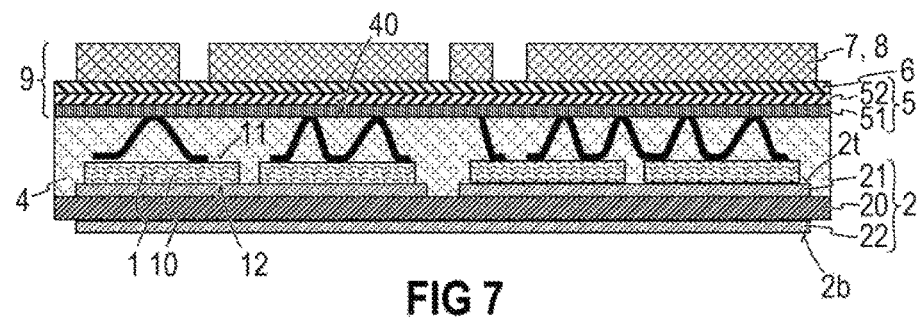
FIGS. 7 and 8 show different steps of a method in which the prefabricated metal film is structured and is used as a mask for structuring underlying conductor layers.

In accordance with an alternative—illustrated in FIG. 7—to the arrangement in accordance with FIG. 5, the metal film 7 can be prefabricated as a structured metal film 7 and, in structured form, be connected to the reinforcement layer 5. The sole difference with respect to the method explained with reference to FIGS. 1 to 5 is that the prefabricated metal film 7 in already structured form is connected to the reinforcement layer 5.

Figure 8:
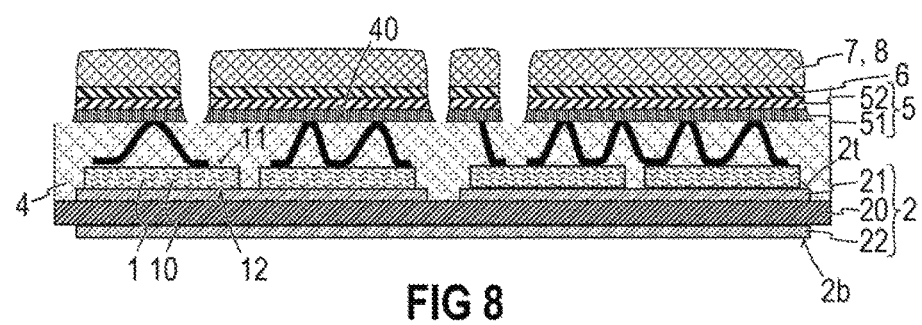

The prefabricated structured metal film 7 connected to the reinforcement layer 5 can then be used as an etching mask 8 in an etching method in which the base layer 5 and optionally also the connection layer 6 are structured as illustrated in FIG. 8. It is accepted here that the metal film 7 is removed somewhat.

Figure 9:
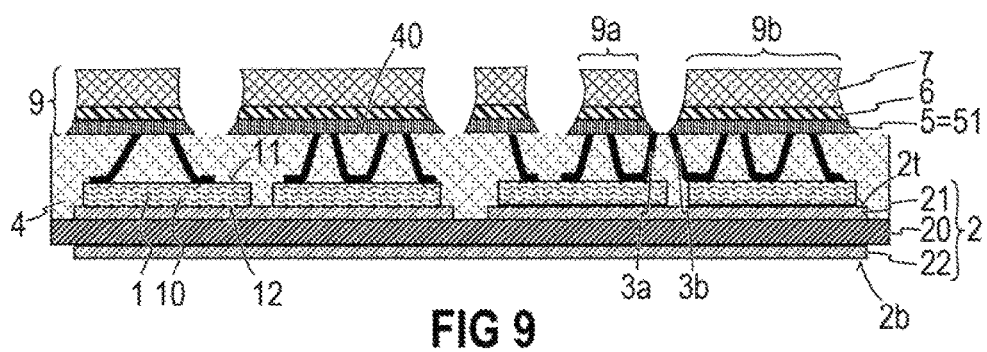
FIG. 9 shows a method in which a contact element is formed as a bonding wire that is interrupted during exposing.

As has already been mentioned above, the reinforcement layer 52 is optional and can accordingly also be omitted. One example of this is shown in FIG. 9. Here the base layer 5 consists exclusively of the seed layer 51. The connection layer 6 here directly adjoins both the seed layer 51 and the metal film 7.

As is likewise shown in FIG. 9, a contact element 3, for example if it is formed as a bonding wire, during exposing can be divided into two portions 3a, 3b separated from one another, each of which is electrically connected to a different portion 9a or 9b of the module metallization 9. As a result, e.g. a single bond loop can be used to electrically connect different, electrically insulated portions 9a, 9b of the module metallization 9. Dividing the contact element 3 into portions 3a and 3b separated from one another can be carried out by the exposing (e.g. the removal of the embedding compound 4 and of the contact elements 3 embedded therein) being carried out far enough (i.e. further than illustrated in FIG. 3).

Figure 10:
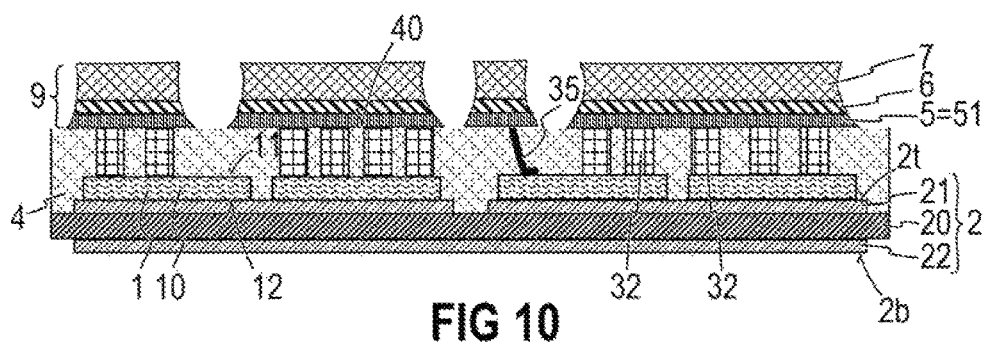
FIG. 10 shows a method in which a contact element is formed as a column or as a small block.

In the previous examples, the contact elements 3 were illustrated by way of example as bonding wires. In principle, contact elements 3 can be formed as any other electrically conductive elements 32, for example as columns or as small blocks or as solder bumps, which is shown schematically in FIG. 10.

As an alternative to bonding or welding, a contact element 3 can also be electrically conductively connected to the upper metallization layer 21 or an upper chip metallization 11 by means of a cohesive connection, for example by means of a soldering, sintering or adhesive bonding connection.

Furthermore, contact elements 3 formed as bonding wires can be formed as bond loops, or as so-called "stud bonds", in which the bonding wire is bonded onto the upper metallization layer 21 or an upper chip metallization at one location and is then drawn upward in a direction away from the circuit carrier 2 and is separated there. As an example of this, a contact element 3 formed as a stud bond 35 is shown in the figures shown. It is pointed out that arbitrary combinations of different types of contact elements 3 can be used in a semiconductor module. Optionally, a contact element 3 can also be connected to the same upper chip metallization 11 at a plurality of locations (e.g. bond locations) and/or, in the finished semiconductor module, it can electrically connect the control terminals of a plurality of semiconductor chips 1 to one another if said control terminals are driven with the same drive signal. Such a control terminal of a semiconductor chip 1 may be, for example, a gate chip metallization arranged at the top side of the relevant semiconductor chip 1 facing away from the circuit carrier 2. Likewise, a contact element 3 can also be used, in the finished semiconductor module, to electrically connect the upper chip metallization 11 of different semiconductor chips 1 to one another.

Suitable materials for the contact elements 3 are, in particular, metals such as copper (Cu), aluminum (Al), molybdenum (Mo), gold (Au) in pure form or as alloys comprising one or more of said metals, or conductive polymer, e.g. conductive epoxy resin filled with Ag.

A contact element 3 can be electrically conductively soldered or bonded or welded or sintered or adhesively bonded onto the upper metallization layer 21 and/or onto an upper chip metallization 11 of a semiconductor chip.

Figure 11:
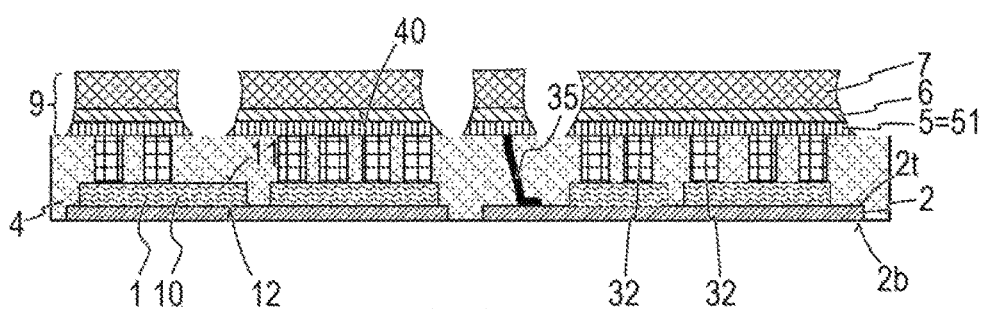
FIG. 11 shows an example of a semiconductor module comprising a circuit carrier formed as a leadframe.

In a departure from the exemplary embodiments shown, the circuit carrier 2 can also be a metallic leadframe that is populated with one or more semiconductor chips 1. A contact element 3 can also be used to produce an electrically conductive connection between the leadframe or a portion of the leadframe and the module metallization 9 by virtue of the contact element 3 being electrically conductively connected to the leadframe. One example of a semiconductor module comprising a circuit carrier 2 formed as a leadframe is shown in FIG. 11.

If the finished module metallization 9 is intended to be structured, it can—as explained—firstly be produced as a closed, non-structured layer on the embedding compound 4, that is to say that the base layer 51, the reinforcement layer 52 (if present), the connection layer 6 and the metal film 7 are initially non-structured.

Alternatively, however, each individual one of the layers 51, 52, 6, 7 mentioned—independently of the others of these layers 51, 52, 6, 7—can firstly be applied as an unstructured layer and then be structured before the next layer is applied, or can be applied in structured fashion already in structured form (e.g. by a deposition into the openings of a mask applied to the underlying layer 51, 52, 6 or the embedding compound 4).

Independently of whether the metal film 7 is applied in structured or unstructured form, it can be formed as a planar layer after it has been cohesively connected to the base layer 5 by means of the connection layer 6.

Portions of the finished module metallization 9, which is structured as necessary, can be used as electrical contacts in order to electrically contact the semiconductor module externally, and/or in order to produce electrically conductive connections between different constituent parts (e.g. the semiconductor chips 1, the upper metallization layer 21, a leadframe 2, a load terminal 11 or 12 of a semiconductor chip 1, a control terminal of a semiconductor chip, etc.). Inter alia, a contact element 3 can also serve to produce an electrical connection between a portion of the module metallization 9 functioning as an auxiliary emitter terminal or auxiliary collector terminal and an emitter load terminal or a collector load terminal of a semiconductor chip 1.

The invention has been explained above on the basis of various exemplary embodiments. The features and method steps explained on the basis of the various exemplary embodiments can be combined with one another in an arbitrary manner here, unless mentioned otherwise.

The invention can also be used in conjunction with so-called "Fan-In Wafer Level Packages". The latter involve semiconductor modules in which the contact elements 3 are arranged exclusively within the lateral boundaries of the basic area(s) of the semiconductor chip(s) 1 of the semiconductor module.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a power semiconductor module, the method comprising:
populating a circuit carrier with a semiconductor chip and with an electrically conductive contact element;
embedding the semiconductor chip and the contact element after populating into a dielectric embedding compound;
exposing the contact element;
producing an electrically conductive base layer which electrically contacts the exposed contact element and which bears on the embedding compound and the exposed contact element; and
applying a prefabricated metal film to the base layer by means of an electrically conductive connection layer.

2. The method of claim 1, wherein after exposing the contact element and before producing the base layer, the embedding compound, in a region where the base layer later bears on the embedding compound, is subjected to a plasma treatment.

3. The method of claim 1, wherein producing the base layer comprises producing an electrically conductive seed layer which bears directly on the embedding compound.

4. The method of claim 3, wherein the electrically conductive seed layer is produced by electroless deposition and/or sputtering.

5. The method of claim 3, wherein the seed layer consists of exactly one or of two or more of the following materials: titanium (Ti); titanium-tungsten (TiW); copper (Cu); palladium (Pd) and nickel (Ni).

6. The method of claim 3, wherein the seed layer has a layer thickness of less than or equal to 5 μm.

7. The method of claim 3, wherein the base layer consists of the seed layer.

8. The method of claim 3, wherein producing the base layer comprises producing an electrically conductive reinforcement layer on the seed layer.

9. The method of claim 8, wherein the electrically conductive reinforcement layer is produced by electrodeposition.

10. The method of claim 8, wherein the reinforcement layer has a layer thickness in a range of 15 µm to 100 µm.

11. The method of claim 8, wherein the reinforcement layer comprises copper.

12. The method of claim 8, wherein the base layer consists of the seed layer and the reinforcement layer.

13. The method of claim 1, wherein after applying the metal film the connection layer directly adjoins both the base layer and the metal film.

14. The method of claim 1, wherein the connection layer is formed as one of the group of a solder layer, a diffusion solder layer, a sintering layer or an adhesive layer.

15. The method of claim 1, wherein the semiconductor chip and the contact element are initially wholly or partly embedded into a wholly or partly liquid embedding compound and the embedding compound is then cured.

16. The method of claim 15, wherein the embedding compound after curing has a coefficient of linear thermal expansion of less than 9 ppm/K.

17. The method of claim 1, wherein the metal film has a layer thickness in a range of 100 µm to 400 µm.

18. The method of claim 1, wherein the metal film comprises at least one of the group of copper (Cu) and aluminum (Al).

19. The method of claim 1, wherein the contact element consists of one of the following metals in pure form or consists of an alloy comprising one or more of the following metals: copper (Cu); aluminum (Al); molybdenum (Mo); and gold (Au), or wherein the contact 4 of 13 element consists of a conductive polymer.

20. The method of claim 1, wherein the circuit carrier comprises a dielectric isolation carrier to which an upper metallization layer is applied.

21. The method of claim 20, wherein the dielectric isolation carrier is a ceramic layer.

22. The method of claim 20, wherein the contact element is electrically conductively soldered, bonded, welded, sintered or adhesively bonded onto the upper metallization layer.

23. The method of claim 1, wherein the contact element is electrically conductively soldered, bonded, welded, sintered or adhesively bonded onto a chip metallization arranged at a side of the semiconductor chip which faces away from the circuit carrier.

24. The method of claim 1, wherein the contact element is a bonding wire, a column, a block or a solder bump.

25. The method of claim 1, wherein after populating the circuit carrier with the contact element and before embedding the semiconductor chip and the contact element, a portion of the contact element is at a distance of further than 1 mm from the circuit carrier.

26. The method of claim 1, wherein the contact element is exposed by grinding, sawing or laser treatment of the embedding compound.

27. The method of claim 1, wherein the contact element and the embedding compound after exposing in each case have a planar surface portion, and wherein the planar surface portion of the contact element and the embedding compound are arranged in one plane.

28. The method of claim 1, wherein the base layer, the connection layer and the metal film are structured directly after applying the metal film.

29. The method of claim 1, wherein the prefabricated metal film is structured, wherein the base layer is structured after applying the metal film to the base layer, and wherein the structured metal film is used as a mask.

* * * * *